US012696739B2

(12) United States Patent
Chowdhury et al.

(10) Patent No.: US 12,696,739 B2
(45) Date of Patent: Jul. 28, 2026

(54) HANDLER WAFER WITH LOW OVERLAY RESIDUAL BACKSIDE PATTERNING

(71) Applicant: INTERNATIONAL BUSINESS MACHINES CORPORATION, Armonk, NY (US)

(72) Inventors: Prabudhya Roy Chowdhury, Albany, NY (US); Daniel Charles Edelstein, White Plains, NY (US); Shay Reboh, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 399 days.

(21) Appl. No.: 18/466,783

(22) Filed: Sep. 13, 2023

(65) Prior Publication Data

US 2025/0087527 A1 Mar. 13, 2025

(51) Int. Cl.
| | |
|---|---|
| *H10W 20/00* | (2026.01) |
| *H10D 84/01* | (2026.01) |
| *H10D 84/03* | (2025.01) |
| *H10W 20/20* | (2026.01) |
| *H10W 20/41* | (2026.01) |

(52) U.S. Cl.
CPC ...... *H10W 20/021* (2026.01); *H10D 84/0186* (2025.01); *H10D 84/038* (2025.01); *H10W 20/0698* (2026.01); *H10W 20/20* (2026.01); *H10W 20/427* (2026.01)

(58) Field of Classification Search
CPC ............. H01L 21/743; H01L 21/76895; H01L 23/5286; H01L 23/535
See application file for complete search history.

(56) References Cited

U.S. PATENT DOCUMENTS

| | | | | |
|---|---|---|---|---|
| 6,821,826 B1 * | 11/2004 | Chan | ....................... | H10P 72/74 |
| | | | | 438/455 |
| 7,892,951 B2 | 2/2011 | Landru | | |
| 8,242,510 B2 | 8/2012 | Hebert | | |
| 8,703,623 B2 | 4/2014 | Chung | | |
| 9,831,115 B2 * | 11/2017 | Peidous | ............. | H10P 90/1914 |
| 9,853,133 B2 * | 12/2017 | Thomas | ............ | H10D 30/0413 |
| 9,875,974 B2 | 1/2018 | Rogers et al. | | |
| 11,126,020 B2 | 9/2021 | Yu | | |
| 11,145,538 B2 | 10/2021 | Libbert | | |
| 11,508,612 B2 | 11/2022 | Peidous | | |
| 2014/0147986 A1 * | 5/2014 | Dang | ...................... | H10P 72/74 |
| | | | | 438/458 |
| 2016/0035616 A1 * | 2/2016 | Cheng | ................... | H10P 50/282 |
| | | | | 438/795 |

(Continued)

FOREIGN PATENT DOCUMENTS

WO 2022074297 A1 4/2022

OTHER PUBLICATIONS

Abdelnaby, A. H., et al. "Numerical Simulation of Silicon Wafer Warpage Due to Thin Film Residual Stresses", IEEE Workshop on Microelectronics and Electron Devices (WMED-2013), 4 pgs.

(Continued)

*Primary Examiner* — Mohsen Ahmadi

(74) *Attorney, Agent, or Firm* — Samuel A. Waldbaum

(57) ABSTRACT

A semiconductor device includes a device wafer, including a silicon wafer. A handler wafer is bonded to the device wafer. The handler wafer includes a 111 crystallographic direction silicon substrate.

12 Claims, 7 Drawing Sheets

100

Interconnects (MOL/BEOL) 118

Device Bonding Oxide Layer 116b

Handler Bonding Oxide Layer 116a

BSPDN 122 / MLW 124 / IC 126

Device Silicon Layer 120

Device Wafer 104

Handler Silicon 114

Handler Silicon Substrate 110

Handler Wafer 102

(56) References Cited

U.S. PATENT DOCUMENTS

| | | | | |
|---|---|---|---|---|
| 2016/0284583 A1* | 9/2016 | Dang | | H10P 72/74 |
| 2017/0125268 A1* | 5/2017 | Dang | | H10P 72/0442 |
| 2017/0170048 A1* | 6/2017 | Tran-Quinn | | H10P 72/74 |
| 2018/0158721 A1 | 6/2018 | Libbert et al. | | |
| 2018/0240965 A1* | 8/2018 | Hebert | | G01R 33/072 |
| 2020/0075443 A1* | 3/2020 | Luo | | H10P 72/74 |
| 2022/0157723 A1* | 5/2022 | Park | | H10W 20/023 |
| 2022/0165601 A1* | 5/2022 | Farooq | | H10P 72/74 |
| 2022/0278073 A1 | 9/2022 | Dallesasse | | |
| 2023/0066183 A1* | 3/2023 | Sano | | H10P 72/0424 |
| 2023/0066893 A1* | 3/2023 | Wang | | H10P 72/50 |
| 2023/0094739 A1* | 3/2023 | Qi | | H10D 30/6744 |
| | | | | 257/347 |
| 2023/0178404 A1* | 6/2023 | Horibe | | H10P 72/53 |
| | | | | 438/16 |
| 2024/0203816 A1* | 6/2024 | Choi | | H10W 40/22 |
| 2024/0215460 A1* | 6/2024 | Abdo | | H10N 60/81 |
| 2024/0290688 A1* | 8/2024 | Kang | | H10W 20/20 |
| 2025/0087527 A1* | 3/2025 | Chowdhury | | H10W 20/021 |

OTHER PUBLICATIONS

Hopcroft, M. A. et al. "What is the Young's Modulus of Silicon?." Journal of Microelectromechanical Systems (2010), vol. 19.2, pp. 229-238.

Goel, S. et al. "Anisotropy of Single-crystal 3c-sic During Nanometric Cutting", Modelling and Simulation in Materials Science and Engineering (2013), vol. 21:065004, 21 pgs.

Bao, S. et al., "A Review of Silicon-Based Wafer Bonding Processes, An Approach to Realize the Monolithic Integration of Si-CMOS and III-V-On-Si Wafers", Journal of Semiconductors (2021), 42(2), p. 023106. Retrieved from: https://www.researching.cn/ArticlePdf/m00098/2021/42/2/023106.pdf. See abstract.

* cited by examiner

100

Interconnects
(MOL/BEOL) 118

Device Bonding
Oxide Layer 116b

Handler Bonding
Oxide Layer 116a

Device Silicon Layer 120

Handler Silicon Substrate 110

Device Wafer 104

Handler Wafer 102

100

Device Wafer 104

Handler Wafer 102

BSPDN 122 / MLW 124 / IC 126

Device Silicon Layer 120

Handler Silicon 114

Handler Silicon Substrate 110

Interconnects (MOL/BEOL) 118

Device Bonding Oxide Layer 116b

Handler Bonding Oxide Layer 116a

202

Device Bonding Oxide Layer 226

BEOL 228

Device Buried Oxide 222

Device Silicon 224

Device Silicon Substrate 220

300

Device Silicon Substrate 220

BEOL 228

Device Silicon 224

Handler Substrate 210

Device Buried Oxide 222

Device Bonding Oxide Layer 226

Handler Bonding Oxide Layer 216

BEOL 228

Device Silicon 224

Device Bonding Oxide Layer 226

Handler Bonding Oxide Layer 216

Handler Substrate 210

400

HANDLER WAFER WITH LOW OVERLAY RESIDUAL BACKSIDE PATTERNING

BACKGROUND

Technical Field

The present disclosure generally relates to transistors, and more particularly, to bonding handler wafer to the wafer devices with low overlay residual backside patterning and methods of creation thereof.

Description of the Related Art

In semiconductor manufacturing, multiple patterns are created on a wafer. These patterns should align perfectly with one another to ensure the device works correctly. Precise alignment of different layers has become more important, especially as device geometries shrink. Conventional mitigating methods to counter the adverse effect of overlay residual and advanced lithography techniques, such as immersion lithography and multiple patterning, have enabled tighter alignment control for smaller features. Further, high-precision lithography and metrology equipment have been used to achieve accurate alignment and measurement of overlay. Real-time monitoring and feedback during manufacturing can help also identify and correct overlay issues early in the process. However, such mitigating methods fail to meet the required accuracy and are all expensive.

SUMMARY

According to an embodiment, a semiconductor device includes a device wafer, which includes a silicon wafer, and a handler wafer bonded to the device wafer. The handler wafer includes a 111 crystallographic direction silicon substrate.

In some embodiments, which can be combined with the previous embodiment, the silicon wafer has a thickness of less than 1 micrometer.

In some embodiments, which can be combined with one or more previous embodiments, a backside of the device wafer is covered by multilevel wiring layers.

In some embodiments, which can be combined with one or more previous embodiments, the multilevel wiring layers include a backside power delivery network (BSPDN).

In some embodiments, which can be combined with one or more previous embodiments, a backside of the device wafer is covered by one or more integrated devices.

In some embodiments, which can be combined with one or more previous embodiments, the device wafer further includes patterned devices and interconnects on a frontside surface.

In some embodiments, which can be combined with one or more previous embodiments, the interconnects include one or more levels of middle of line/back end of line (MOL/BEOL).

In some embodiments, which can be combined with one or more previous embodiments, the silicon wafer includes a 100 crystallographic direction or a 110 crystallographic direction silicon wafer.

In some embodiments, which can be combined with one or more previous embodiments, the device wafer further includes a buried oxide (BOX).

In some embodiments, which can be combined with one or more previous embodiments, the handler wafer, and the device wafer are bonded through a bonding oxide layer.

According to another embodiment, a method of formation of a semiconductor device includes forming a device wafer, wherein the device wafer includes a first silicon substrate, forming a handler wafer, bonding the handler wafer to the device wafer, and removing portions of the first silicon substrate. The handler wafer includes a 111 crystallographic direction second silicon substrate.

In some embodiments, which can be combined with one or more previous embodiments, the method includes covering a backside of the device wafer with multilevel wiring layers. The multilevel wiring layers include a backside power delivery network (BSPDN).

In some embodiments, which can be combined with one or more previous embodiments, the method includes covering a backside of the device wafer with one or more integrated devices.

In some embodiments, which can be combined with one or more previous embodiments, the method includes forming patterned devices and interconnects on a frontside surface of the device wafer.

In some embodiments, which can be combined with one or more previous embodiments, the interconnects include one or more levels of middle of line/back end of line (MOL/BEOL).

In some embodiments, which can be combined with one or more previous embodiments, removing portions of the first silicon substrate includes utilizing one or more of: grinding, chemical mechanical polishing, wet etching, and dry etching.

In some embodiments, which can be combined with one or more previous embodiments, the method includes forming a buried oxide (BOX) on the device wafer.

In some embodiments, which can be combined with one or more previous embodiments, bonding the handler wafer to the device wafer is performed through a bonding oxide layer.

According to yet another embodiment, a method of formation of a semiconductor device includes forming a silicon wafer over a device wafer and bonding a handler wafer to the device wafer. The handler wafer includes a 111 crystallographic direction silicon substrate.

These and other features will become apparent from the following detailed description of illustrative embodiments thereof, which is to be read in connection with the accompanying drawings.

BRIEF DESCRIPTION OF THE DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all the components or steps that are illustrated. When the same numeral appears in different drawings, it refers to the same or like components or steps.

DETAILED DESCRIPTION

Overview

Figure 1A:
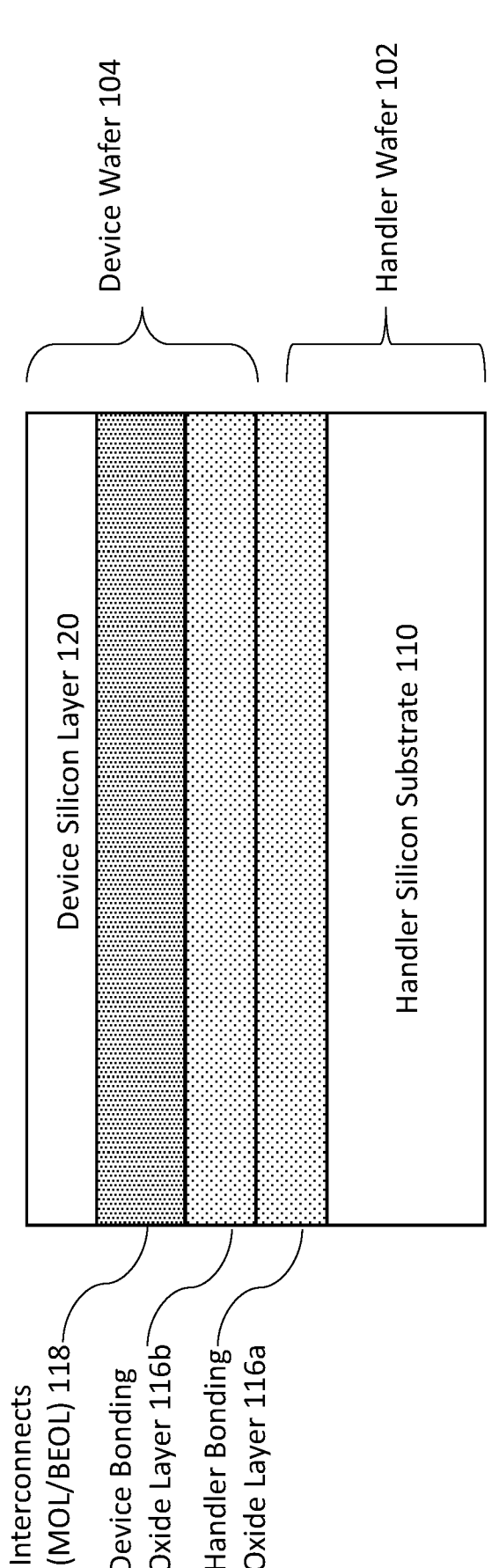
FIG. 1A illustrates a semiconductor device, in accordance with some embodiments.

In the following detailed description, numerous specific details are set forth by way of examples to provide a thorough understanding of the relevant teachings. However, it should be apparent that the present teachings may be practiced without such details. In other instances, well-known methods, procedures, components, and/or circuitry have been described at a relatively high-level, without detail, to avoid unnecessarily obscuring aspects of the present teachings.

In one aspect, spatially related terminology such as "front," "back," "top," "bottom," "beneath," "below," "lower," above," "upper," "side," "left," "right," and the like, is used with reference to the orientation of the Figures being described. Since components of embodiments of the disclosure can be positioned in a number of different orientations, the directional terminology is used for purposes of illustration and is in no way limiting. Thus, it will be understood that the spatially relative terminology is intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as below. The device may be otherwise oriented (rotated 90 degrees or viewed or referenced at other orientations) and the spatially relative descriptors used herein should be interpreted accordingly.

As used herein, the terms "lateral" and "horizontal" describe an orientation parallel to a first surface of a chip.

As used herein, the term "vertical" describes an orientation that is arranged perpendicular to the first surface of a chip, chip carrier, or semiconductor body.

As used herein, the terms "coupled" and/or "electrically coupled" are not meant to mean that the elements must be directly coupled together—intervening elements may be provided between the "coupled" or "electrically coupled" elements. In contrast, if an element is referred to as being "directly connected" or "directly coupled" to another element, there are no intervening elements present. The term "electrically connected" refers to a low-ohmic electric connection between the elements electrically connected together.

Although the terms first, second, etc., may be used herein to describe various elements, these elements should not be limited by these terms. These terms are only used to distinguish one element from another. For example, a first element could be termed a second element, and similarly, a second element could be termed a first element without departing from the scope of example embodiments. As used herein, the term "and/or" includes any and all combinations of one or more of the associated listed items.

Example embodiments are described herein with reference to cross-sectional illustrations that are schematic illustrations of idealized or simplified embodiments (and intermediate structures). As such, variations from the shapes of the illustrations as a result, for example, of manufacturing techniques and/or tolerances, may be expected. Thus, the regions illustrated in the figures are schematic in nature, and their shapes do not necessarily illustrate the actual shape of a region of a device and do not limit the scope.

It is to be understood that other embodiments may be used, and structural or logical changes may be made without departing from the spirit and scope defined by the claims. The description of the embodiments is not limiting. In particular, elements of the embodiments described hereinafter may be combined with elements of different embodiments.

As used herein, certain terms are used indicating what may be considered an idealized behavior, such as, for example, "lossless," "superconductor," or "superconducting," which are intended to cover functionality that may not be exactly ideal but is within acceptable margins for a given application. For example, a certain level of loss or tolerance may be acceptable such that the resulting materials and structures may still be referred to by these "idealized" terms.

According to an embodiment, a semiconductor device includes a device wafer, which includes a silicon wafer, and a handler wafer bonded to the device wafer. The handler wafer includes a 111 crystallographic direction silicon substrate. Bonding the device wafer to a 111 crystallographic direction silicon substrate can result in a lower overlay residual.

In some embodiments, which can be combined with the previous embodiment, the silicon wafer has a thickness of less than 1 micrometer. Thus, the silicon wafer is a thin layer of silicon. This enables fine-pitched backside connections aligned and electrically connected to the frontside devices at convention patterning and metallization aspect ratios and further minimizes parasitic capacitances of the frontside silicon devices.

In some embodiments, which can be combined with one or more previous embodiments, a backside of the device wafer is covered by multilevel wiring layers. Thus, the backside of the device wafer can include various components.

In some embodiments, which can be combined with one or more previous embodiments, the multilevel wiring layers include a backside power delivery network (BSPDN). Thus, the backside of the device wafer can include components that can enable the device wafer to connect to other devices.

In some embodiments, which can be combined with one or more previous embodiments, a backside of the device wafer is covered by one or more integrated devices. Thus, the device wafer can be part of a device, including multiple integrated circuits and devices.

In some embodiments, which can be combined with one or more previous embodiments, the device wafer further includes patterned devices and interconnects on a frontside surface. Thus, the device wafer can be a standalone device and can be able to connect to other semiconductor devices.

In some embodiments, which can be combined with one or more previous embodiments, the interconnects include one or more levels of middle of line/back end of line (MOL/BEOL). The MOL/BEOL can enable the device wafer to connect to other devices.

In some embodiments, which can be combined with one or more previous embodiments, the silicon wafer includes a 100 crystallographic direction or a 110 crystallographic direction silicon wafer. Thus, the conventional silicon wafers that are used to fabricate device wafers can be used to form the device wafer, and no additional adjustment is required to fabricate the device wafer.

In some embodiments, which can be combined with one or more previous embodiments, the device wafer further includes a buried oxide (BOX). Thus, the device wafer's top layer (where the transistors are built) is isolated from the bottom silicon substrate. This isolation can substantially reduce unwanted parasitic currents between the devices on the top silicon layer and the substrate. Additionally, the buried oxide layer can serve as a selective dry or wet etch layer for thinning down the silicon substrate that includes the buried oxide layer.

In some embodiments, which can be combined with one or more previous embodiments, the handler wafer, and the device wafer are bonded through a bonding oxide layer. The bonding oxide layer can provide a suitable way to merge the device wafer and the handler wafer while ensuring electrical isolation. In some embodiments, an organic or a polymeric bonding material is used as the bonging oxide layer. In such embodiments, the organic polymeric bonding layer can be removed by being ablated by ultraviolet (UV) or infrared (IR) laser through the handler silicon. In some embodiments, the organic polymeric bonding layer can be removed by being ablated by thermal processing.

According to another embodiment, a method of formation of a semiconductor device includes forming a device wafer, wherein the device wafer includes a first silicon substrate, forming a handler wafer, bonding the handler wafer to the device wafer, and removing portions of the first silicon substrate. The handler wafer includes a 111 crystallographic direction second silicon substrate. Bonding the device wafer to a 111 crystallographic direction silicon substrate can result in a lower overlay residual.

In some embodiments, which can be combined with one or more previous embodiments, the method includes covering a backside of the device wafer with multilevel wiring layers. The multilevel wiring layers include a backside power delivery network (BSPDN). Thus, the backside of the device wafer can include components that can enable the device wafer to connect to other devices.

In some embodiments, which can be combined with one or more previous embodiments, the method includes covering a backside of the device wafer with one or more integrated devices. Thus, the device wafer can be part of a device, including multiple integrated circuits and devices.

In some embodiments, which can be combined with one or more previous embodiments, the method includes forming patterned devices and interconnects on a frontside surface of the device wafer. Thus, the device wafer can be a standalone device and can be able to connect to other semiconductor devices.

In some embodiments, which can be combined with one or more previous embodiments, the interconnects include one or more levels of middle of line/back end of line (MOL/BEOL). The MOL/BEOL can enable the device wafer to connect to other devices.

In some embodiments, which can be combined with one or more previous embodiments, removing portions of the first silicon substrate includes utilizing one or more of: grinding, chemical mechanical polishing, wet etching, and dry etching. The use of various methods to remove portions of the first silicon substrate can guarantee an accurate removal process and cause the formation of a uniform layer.

In some embodiments, which can be combined with one or more previous embodiments, the method includes forming, a buried oxide (BOX) on the device wafer. Thus, the device wafer's top layer (where the transistors are built) is isolated from the bottom silicon substrate. This isolation can substantially reduce unwanted parasitic currents between the devices on the top silicon layer and the substrate.

In some embodiments, which can be combined with one or more previous embodiments, bonding the handler wafer to the device wafer is performed through a bonding oxide layer. The bonding oxide layer can provide an effective way to merge the device wafer and the handler wafer while ensuring electrical isolation.

According to yet another embodiment, a method of formation of a semiconductor device includes forming a silicon wafer over a device wafer and bonding a handler wafer to the device wafer. The handler wafer includes a 111 crystallographic direction silicon substrate. Bonding the device wafer to a 111 crystallographic direction silicon substrate can result in a lower overlay residual.

The concepts herein relate to minimizing overlay residual in a semiconductor device after backside patterning. In the semiconductor industry, overlay residual refers to the difference between the intended alignment of multiple pattern layers in the fabrication process and the actual alignment achieved during manufacturing. Overlay residual is a salient parameter that measures the accuracy of the alignment between successive layers of patterns on a semiconductor device. Typically, multiple layers of patterns are sequentially transferred onto a wafer using methods such as lithography and etching processes. Each layer is precisely aligned with the previously patterned layers to ensure proper functionality and performance of the final device. Overlay residual is used to quantify the level of misalignment between these layers.

Several methods have been used to mitigate the adverse effect of overlay residual. Advanced lithography techniques, such as immersion lithography and multiple patterning, enable tighter alignment control for smaller features. High-precision lithography and metrology equipment are used to achieve accurate alignment and measurement of overlay. Real-time monitoring and feedback during manufacturing can help identify and correct overlay issues early in the process. Further, stringent process control measures are implemented to minimize variations that can lead to misalignment. However, none of these methods has satisfied the strict requirements of the semiconductor industry. High operation costs, which resulted in higher production costs, and the complexity of implementing such methods have caused the overlay residual problem to remain a challenging issue in the semiconductor industry.

To tackle the above-mentioned problems, disclosed is a semiconductor device with a handler wafer that can mitigate the overlay residual. The handler wafer (also known as the carrier wafer) utilizes a silicon substrate with <111> (i.e., 111 crystallographic direction silicon), which is a different crystallographic orientation than the conventional silicon substrate used as the handler wafer, i.e., <100> or <110>. In embodiments where a de-bondable bonding layer is used, e.g., polyimide, thermoset, etc., as a result of utilizing the <111> silicon substrate in the handler wafer, after the debonding process, the disclosed device wafer shows mitigated overlay residual compared to conventional device wafers.

Accordingly, the teachings herein provide methods and systems of semiconductor device formation with a handler wafer. The techniques described herein may be implemented in a number of ways. Example implementations are provided below with reference to the following figures.

Example Semiconductor Device with Handler Wafer Structure

Reference now is made to FIG. 1A, which is a simplified cross-section view of a semiconductor device 100, consistent with an illustrative embodiment. The disclosed semiconductor device 100 can include a handler wafer 102 bonded on a device wafer 104. The handler wafer 102 can include a handler silicon substrate 110, and a handler bonding oxide layer 116a. The device wafer 104 can include a device bonding oxide layer 116b, middle of line/back end of line, MOL/BEOL, 118, and a device silicon device layer 120.

In some embodiments, the device wafer 104 can include patterned devices and interconnects on a frontside surface. The interconnects can include one or more levels of MOL/BEOL. The handler wafer 102 and the device wafer 104 can be bonded through the handler and device bonding oxide layers 116a and 116b, which are formed on the handler wafer 102 and the device wafer 104, respectively.

The handler silicon substrate 110 can be part of a handler wafer 102. A handler wafer, also known as a carrier wafer or test wafer, is a substrate used in semiconductor manufacturing to facilitate the handling, testing, and processing of individual semiconductor devices or dies during various stages of production. The handler wafer 102 can be made from silicon and can protect delicate devices, provide mechanical support, and enable efficient batch processing. Further, the handler wafer can facilitate mounting multiple devices onto a single handler wafer, allowing for simultaneous testing and processing of several devices in a single batch. This increases throughput and efficiency in manufacturing. In an embodiment, the handler wafer 102 can shield sensitive and fragile devices from potential contamination, electrostatic discharge, and physical damage during various manufacturing steps.

Typically, the silicon substrate that is used in the handler wafer 102 has a similar crystallographic orientation as the silicon substrate used in the device wafer 104. That is, the handler wafer's silicon substrate is typically a <100> silicon. However, after the backside patterning processes are performed, the issue of non-linear overlay residual causes a challenge in forming a high-quality device wafer. Such an overlay residual can occur as a result of non-uniform silicon-silicon bonding, combined with variation of silicon crystalline material properties in the plane of the wafer, which can produce a non-uniform distortion or displacement. The non-uniform silicon-silicon bonding distortion refers to the uneven or varying deformation or displacement that occurs when two silicon components or substrates, e.g., the device wafer and the handler wafer, are bonded together. This distortion can arise due to differences in temperature, stress, material properties, or processing conditions during the bonding process, and can have significant implications for the performance, reliability, and functionality of the semiconductor device 100. In an embodiment, the silicon wafer can include a <110> silicon wafer.

The <100> crystal lattice used in conventional semiconductor devices is oriented along a specific set of directions defined by the Miller indices <100>. This orientation means that the lattice planes intersect the surface of the silicon wafer at right angles. The <100> silicon orientation results in a rectangular pattern of atoms on the surface of the wafer. This orientation is often used as a standard reference orientation in semiconductor manufacturing. The <100> silicon is relatively isotropic in terms of material properties, meaning its properties are more consistent in different directions compared to other orientations. The <100> silicon wafers are more reactive to certain etchants, making them easier to etch and pattern during semiconductor processing.

However, using conventional handler wafer silicon substrates, i.e., <100> silicon, can cause high overlay residuals after device wafer bonding and backside grinding are performed. High overlay residual is obtained as a result of 90° crystalline symmetry of <100> wafer and non-uniform wafer-to-wafer bonding stress.

Unlike conventional semiconductor devices, the semiconductor device 100 can include a handler wafer 102 with a <111> silicon substrate. In some embodiments, since the crystal lattice of the silicon substrate 110 is oriented along a specific set of directions defined by the Miller indices 111, i.e., the lattice planes intersect the surface of the silicon wafer at angles of approximately 54.7 degrees, the handler silicon substrate 110 has a hexagonal pattern of atoms on the surface of the handler wafer 102. In some embodiments, the silicon substrate 110 exhibits anisotropic material properties, meaning that its properties can vary significantly based on the direction of measurement. This can impact material etching, electrical properties, and mechanical behavior. The handler silicon substrate 110 can selectively react to different etchants, i.e., can be less reactive to certain etchants compared to other orientations. This can influence etching processes during semiconductor device manufacturing.

In an embodiment, the handler wafer's use of <111> silicon substrate, i.e., the handler silicon substrate 110, has the least change in Young's modulus and Poisson's ratio along the surface directions. Young's modulus is a fundamental mechanical property that quantifies how a material deforms under an applied load and then returns to its original shape when the load is removed, and is a measure of a material's stiffness and its ability to resist elastic deformation. Young's modulus is defined as the ratio of stress applied to a material to the resulting strain (change in length or deformation) caused by the stress and is relevant in the linear elastic region of a material's stress-strain curve, where the material behaves in a reversible and elastic manner. Beyond this region, the material may undergo plastic deformation. In the semiconductor industry, Young's modulus affects the mechanical behavior of materials used in microelectronics, influencing the design and reliability of devices. Poisson's ratio quantifies the relative change in cross-sectional dimensions of a material when it is subjected to axial deformation (stretching or compression) along a specific direction. It describes the lateral contraction (negative Poisson's ratio) or expansion (positive Poisson's ratio) that occurs perpendicular to the direction of applied force.

The <111> orientation of the handler silicon substrate 110 can lower the non-linear overlay residual pattern due to lower changes in properties across the surface of the handler silicon substrate 110. In some embodiments, utilizing the <111> orientation handler silicon substrate 110 can lead to a reduction of overlay residual due to lower variation in the <111> silicon substrate's orthotropic properties along the plane of the wafer. In some embodiments, the silicon substrate has a thickness of less than one nanometer.

Optionally, in some embodiments, the handler wafer can include a buried oxide (not shown). In such embodiments, the handler buried oxide, which is a layer of insulating material, such as silicon dioxide (SiO2), can electrically isolate the layers above and below it. The insulating nature of buried oxide prevents electrical interactions between the layers above and below it, which is especially valuable for reducing unwanted capacitance between components and improving device performance. In some embodiments, buried oxide can provide thermal isolation between different layers of the semiconductor device 100, preventing heat from propagating from one layer to another.

Each of the handler and device bonding oxide layers 116a and 116b refers to a thin layer of silicon dioxide (SiO2) that serves as an interface between two semiconductor wafers or between a semiconductor wafer and another substrate, enabling them to be bonded together through the wafer bonding. The handler and device bonding oxide layers 116a and 116b can create a strong bond at the molecular level, allowing the wafers to be joined together without the need for additional adhesives. Additionally, wafer bonding using bonding oxides, i.e., the handler and device bonding oxide layers 116a and 116b, allows different materials, such as silicon and glass, to be integrated into a single structure, enabling the creation of complex devices with diverse functionalities.

BEOL 118 can include metal interconnects, dielectric layers, and other components that connect and route signals between different devices and structures on the semiconductor device 100. In some embodiments, BEOL 118 includes intricate networks of metal interconnects that connect transistors, capacitors, and other active devices fabricated during the front end of line (FEOL) process. These interconnects can form the pathways for electrical signals to flow between different components on the semiconductor device 100. BEOL 118 can include dielectric materials deposited between metal interconnects to electrically insulate them and prevent unwanted electrical interactions or short circuits. These dielectric layers also serve as a barrier to minimize signal loss due to parasitic capacitance. The BEOL 118 can include vias as small openings etched through the dielectric layers that allow electrical connections to be made vertically between different metal layers. In some embodiments, the topmost layer of the BEOL 118 can include a protective capping layer and passivation layer to shield the underlying components from environmental factors and prevent contamination. BEOL 118 can further include the power distribution networks, ensuring that power is efficiently delivered to all components of the chip.

In the illustrative example depicted in FIG. 1A, the semiconductor device 100 is depicted to include silicon as the silicon device layer, i.e., the device silicon layer 120, while it will be understood that other types as substrates may be used as well, including, without limitation, monocrystalline Si, silicon germanium (SiGe), III-V compound semiconductor, II-VI compound semiconductor, or semiconductor-on-insulator (SOI). Group III-V compound semiconductors, for example, include materials having at least one group III element and at least one group V element, such as one or more of aluminum gallium arsenide (AlGaAs), aluminum gallium nitride (AlGaN), aluminum arsenide (AlAs), aluminum indium arsenide (AlIAs), aluminum nitride (AlN), gallium antimonide (GaSb), gallium aluminum antimonide (GaAlSb), gallium arsenide (GaAs), gallium arsenide antimonide (GaAsSb), gallium nitride (GaN), indium antimonide (InSb), indium arsenide (InAs), indium gallium arsenide (InGaAs), indium gallium arsenide phosphide (InGaAsP), indium gallium nitride (InGaN), indium nitride (InN), indium phosphide (InP) and alloy combinations including at least one of the foregoing materials. The alloy combinations can include binary (two elements, e.g., gallium (III) arsenide (GaAs)), ternary (three elements, e.g., InGaAs), and quaternary (four elements, e.g., aluminum gallium indium phosphide (AlInGaP)) alloys.

In various embodiments, the device silicon layer 120 may include any suitable material or combination of materials, such as doped or undoped silicon, glass, dielectrics, etc. For example, the substrate may include a silicon-on-insulator (SOI) structure, e.g., with a buried insulator layer, or a bulk material substrate, e.g., with appropriately doped regions, typically referred to as wells. In another embodiment, the substrate may be silicon with silicon oxide, nitride, or any other insulating film on top.

Figure 1B:
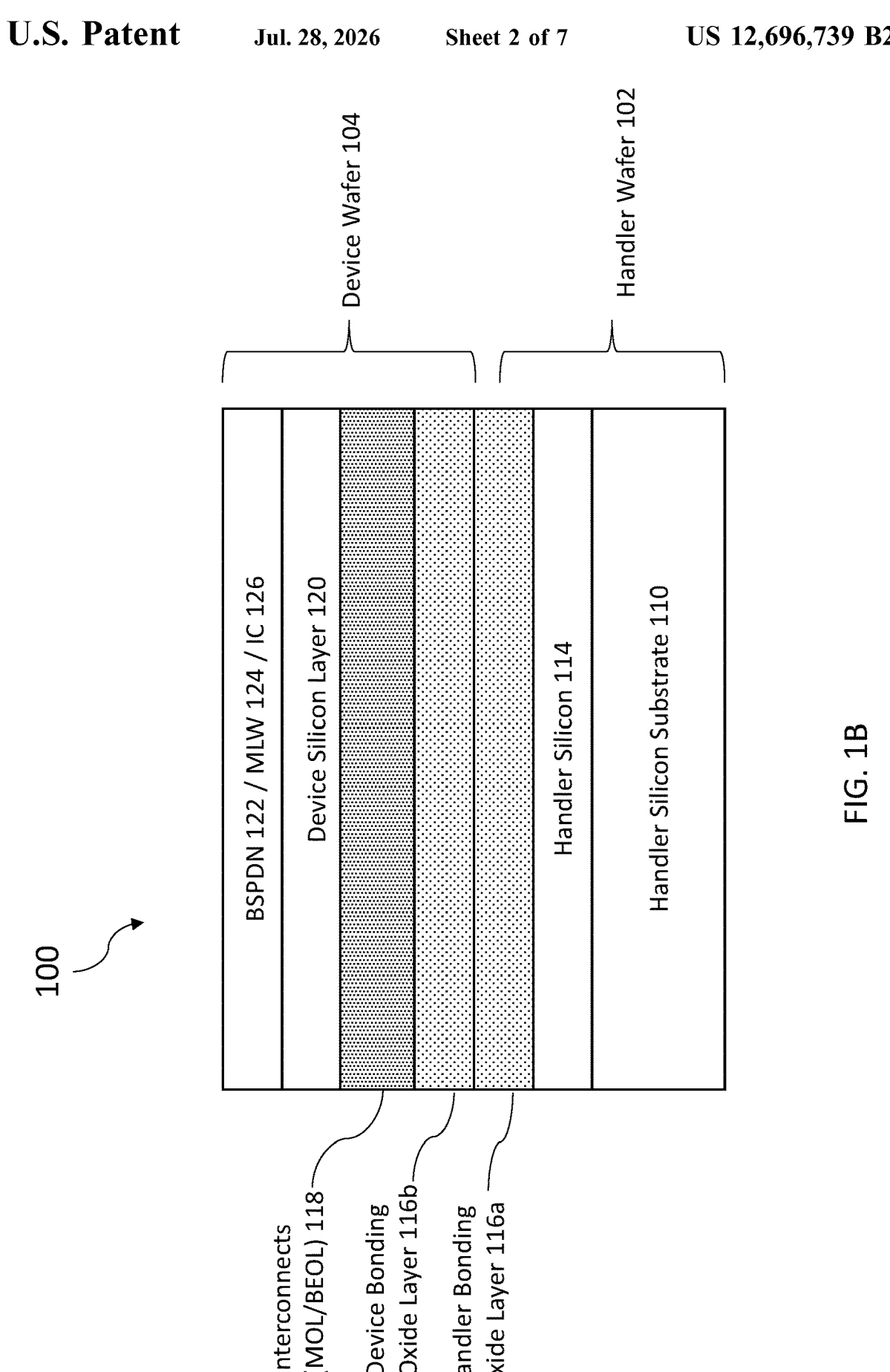
FIG. 1B illustrates a semiconductor device, in accordance with some embodiments.

Referring to FIG. 1B now, the semiconductor device 100 can include additional components, in accordance with some embodiments. In some embodiments, the handler wafer 102 can include a handler silicon 114. In an embodiment, the backside of the device wafer 104 can be covered by multi-level wiring layers, MLW, 124. The MLW 124 can include a backside power delivery network, BSPDN 122. Additionally, or in the alternative, the backside of the device wafer 104 can be covered by one or more integrated devices, ICs, 126.

In the illustrative example depicted in FIG. 1B, the semiconductor device 100 is depicted to include silicon as the substrate, i.e., the handler silicon 114, while it will be understood that other types as substrates may be used as well, including, without limitation, monocrystalline Si, silicon germanium (SiGe), III-V compound semiconductor, II-VI compound semiconductor, or semiconductor-on-insulator (SOI). Group III-V compound semiconductors, for example, include materials having at least one group III element and at least one group V element, such as one or more of aluminum gallium arsenide (AlGaAs), aluminum gallium nitride (AlGaN), aluminum arsenide (AlAs), aluminum indium arsenide (AlIAs), aluminum nitride (AlN), gallium antimonide (GaSb), gallium aluminum antimonide (GaAlSb), gallium arsenide (GaAs), gallium arsenide antimonide (GaAsSb), gallium nitride (GaN), indium antimonide (InSb), indium arsenide (InAs), indium gallium arsenide (InGaAs), indium gallium arsenide phosphide (InGaAsP), indium gallium nitride (InGaN), indium nitride (InN), indium phosphide (InP) and alloy combinations including at least one of the foregoing materials. The alloy combinations can include binary (two elements, e.g., gallium (III) arsenide (GaAs)), ternary (three elements, e.g., InGaAs), and quaternary (four elements, e.g., aluminum gallium indium phosphide (AlInGaP)) alloys.

In various embodiments, the handler silicon 114 may include any suitable material or combination of materials, such as doped or undoped silicon, glass, dielectrics, etc. For example, the substrate may include a silicon-on-insulator (SOI) structure, e.g., with a buried insulator layer, or a bulk material substrate, e.g., with appropriately doped regions, typically referred to as wells. In another embodiment, the substrate may be silicon with silicon oxide, nitride, or any other insulating film on top.

Example Processes for a Semiconductor Device with Handler Wafer Structures

Figure 3:
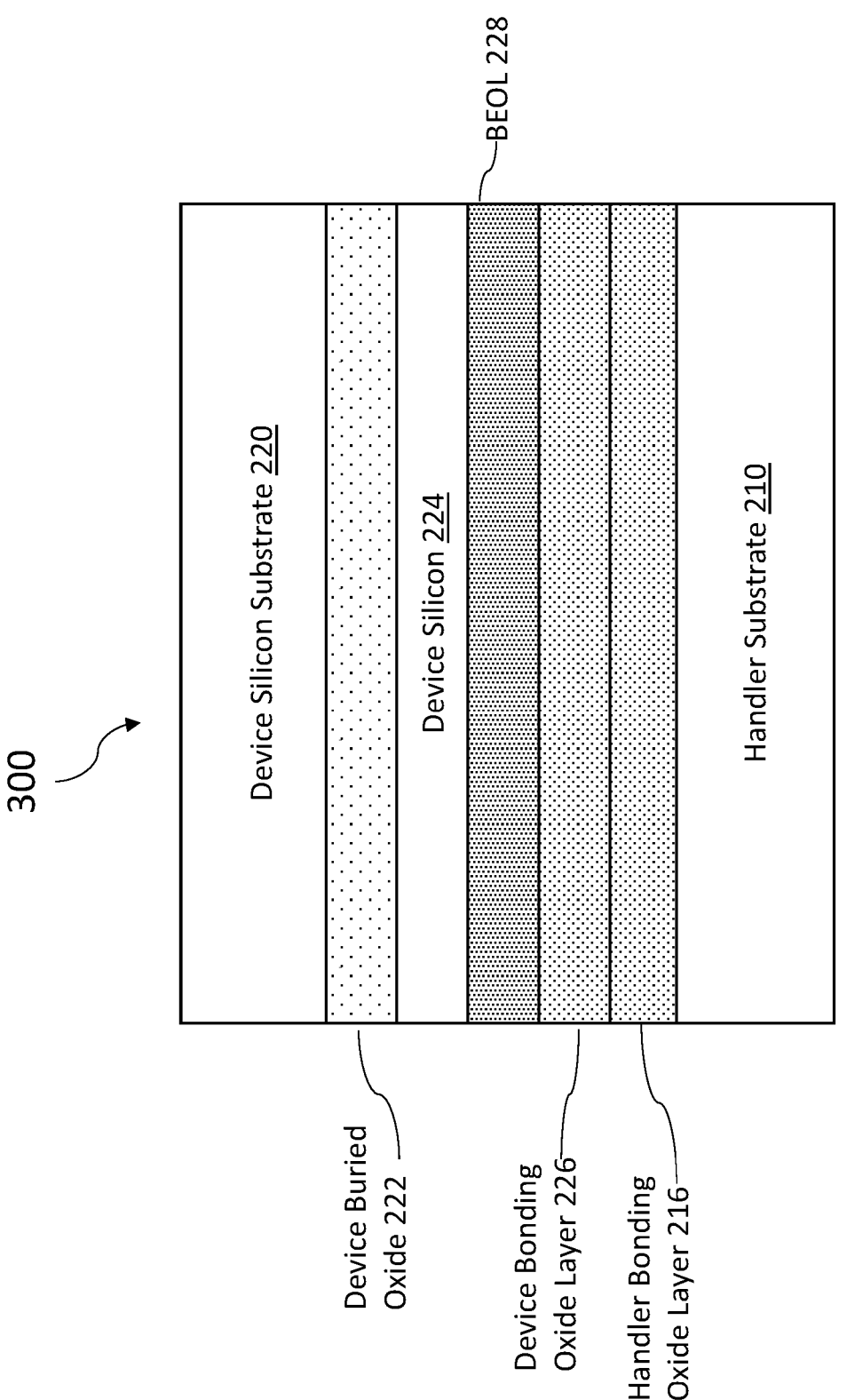
FIG. 3 illustrates a semiconductor device after the bonding the handler wafer and the device wafer, in accordance with some embodiments.
Figure 4:
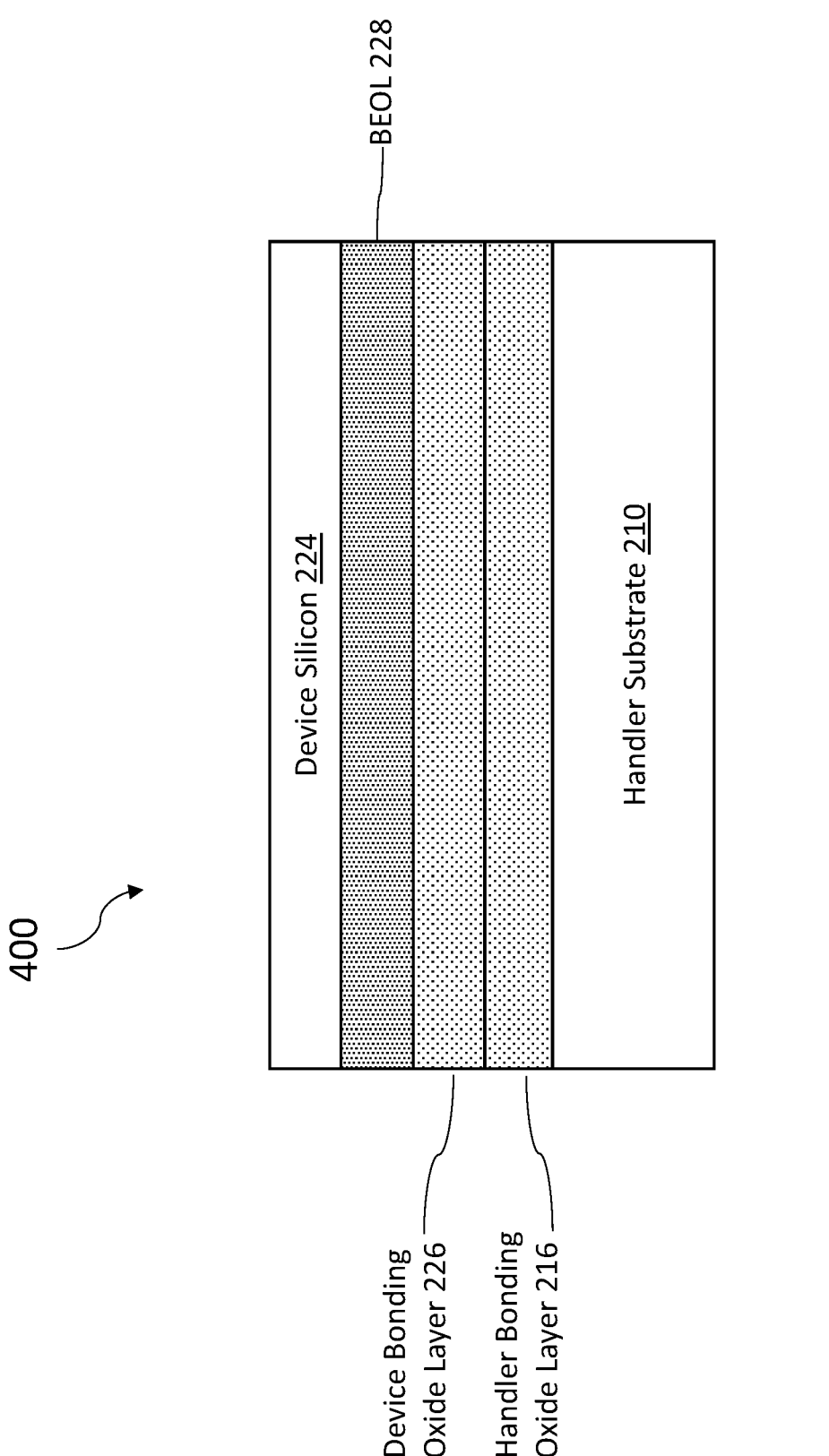
FIG. 4 illustrates a semiconductor device after the backside patterning, in accordance with some embodiments.

With the foregoing description of an example semiconductor device 100, it may be helpful to discuss an example process of manufacturing the same. To that end, FIGS. 2-4 illustrate various steps in the manufacture of a semiconductor device 100, consistent with illustrative embodiments. It is worth mentioning that the semiconductor device 100 depicted in FIG. 1 can be the same as the semiconductor device depicted in FIGS. 2-4.

Figure 2A:
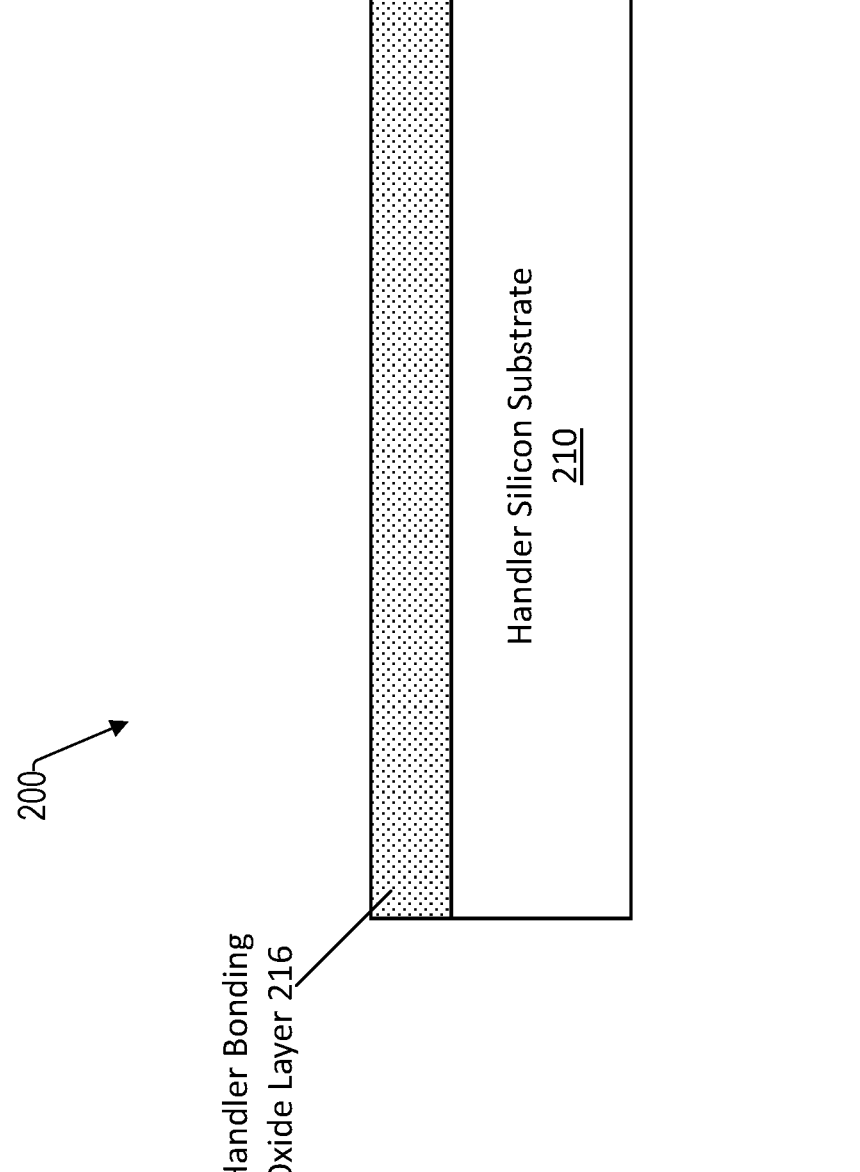
FIG. 2A illustrates a handler wafer before bonding, in accordance with some embodiments.
Figure 2B:
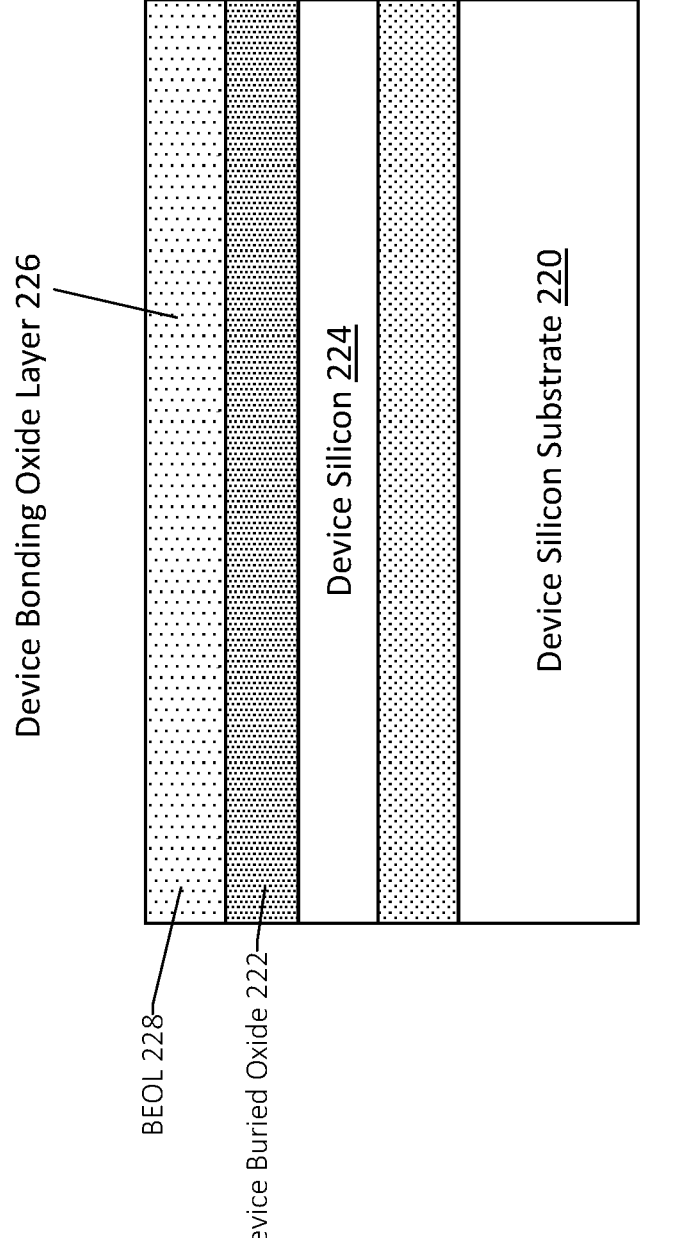
FIG. 2B illustrates a device wafer before bonding, in accordance with some embodiments.

Referring to FIGS. 2A and 2B now, a handler wafer 200 and a device wafer 202 are illustrated before bonding together, in accordance with some embodiments. As shown in FIG. 2A, the handler wafer 200 can include a handler silicon substrate 210, and a handler bonding oxide layer 216. The device wafer 202 can include a device silicon substrate 220, a device buried oxide 222, a device silicon 224, a BEOL 228, and a device bonding oxide layer 226.

In some embodiments, the handler wafer 200 can include a <111> silicon substrate, i.e., the handler silicon substrate 210. In some embodiments, the handler silicon substrate 210 has a hexagonal pattern of atoms on the surface of the handler wafer and exhibits anisotropic material properties. The <111> orientation of the handler silicon substrate 210 can lead to a lower non-linear overlay residual pattern due to lower changes in properties across the surface of the handler silicon substrate 210.

In optional embodiments where the handler wafer includes a buried oxide, in order to fabricate the handler buried oxide, high-energy ions (e.g., oxygen ions) are implanted into the handler silicon substrate 210. The ions become embedded in the handler silicon substrate 210 and create a buried layer of oxide. In an embodiment, the implanted wafer can be subjected to high-temperature annealing. This process allows the oxygen ions to diffuse within the silicon and form a continuous buried oxide layer. In some embodiments, the material used for the handler buried oxide is silicon dioxide (SiO2). In some cases, other insulating materials may be used, but SiO2 is a standard choice due to its compatibility with silicon semiconductor processes and its established performance characteristics.

Optionally, in some embodiments, the handler wafer 200 can include a handler silicon (not shown). While the handler silicon can be made of silicon, it will be understood that other types as substrates may be used as well, including, without limitation, monocrystalline Si, silicon germanium (SiGe), III-V compound semiconductor, II-VI compound semiconductor, or semiconductor-on-insulator (SOI). Group III-V compound semiconductors, for example, include materials having at least one group III element and at least one group V element, such as one or more of aluminum gallium arsenide (AlGaAs), aluminum gallium nitride (AlGaN), aluminum arsenide (AlAs), aluminum indium arsenide (AlIAs), aluminum nitride (AlN), gallium antimonide (GaSb), gallium aluminum antimonide (GaAlSb), gallium arsenide (GaAs), gallium arsenide antimonide (GaAsSb), gallium nitride (GaN), indium antimonide (InSb), indium arsenide (InAs), indium gallium arsenide (InGaAs), indium gallium arsenide phosphide (InGaAsP), indium gallium nitride (InGaN), indium nitride (InN), indium phosphide (InP) and alloy combinations including at least one of the foregoing materials. The alloy combinations can include binary (two elements, e.g., gallium (III) arsenide (GaAs)), ternary (three elements, e.g., InGaAs), and quaternary (four elements, e.g., aluminum gallium indium phosphide (AlInGaP)) alloys.

In various embodiments, the handler silicon may include any suitable material or combination of materials, such as doped or undoped silicon, glass, dielectrics, etc. For example, the substrate may include a silicon-on-insulator (SOI) structure, e.g., with a buried insulator layer, or a bulk material substrate, e.g., with appropriately doped regions, typically referred to as wells. In another embodiment, the substrate may be silicon with silicon oxide, nitride, or any other insulating film on top.

In order to fabricate the handler bonding oxide layer 216, the handler wafer's surface is oxidized in an oxygen-rich environment at elevated temperatures, resulting in the growth of a thin layer of silicon dioxide on the surface. After oxidation, the oxide layer can be cleaned to remove any impurities or contaminants that may have accumulated during the oxidation process. Prior to bonding, the surfaces of the wafers to be bonded, i.e., the handler wafer and the device wafer, can be treated to ensure proper alignment and bonding quality. The wafers are brought into contact, and pressure or heat (thermal annealing) can be applied to initiate the bonding process. The oxide layers, i.e., the handler bonding oxide layer 216 and the device bonding oxide layer 226, at the interface create covalent bonds between the wafers. The handler bonding oxide layer 216 can be composed of silicon dioxide (SiO2).

Moving on to the device wafer 202 now, in the illustrative example depicted in FIG. 2B, the device wafer 202 is depicted to include silicon as substrates, i.e., the device silicon substrate 220 and the device silicon 224, while it will be understood that other types as substrates may be used as well, including, without limitation, monocrystalline Si, silicon germanium (SiGe), III-V compound semiconductor, II-VI compound semiconductor, or semiconductor-on-insulator (SOI). Group III-V compound semiconductors, for example, include materials having at least one group III element and at least one group V element, such as one or more of aluminum gallium arsenide (AlGaAs), aluminum gallium nitride (AlGaN), aluminum arsenide (AlAs), aluminum indium arsenide (AlIAs), aluminum nitride (AlN), gallium antimonide (GaSb), gallium aluminum antimonide (GaAlSb), gallium arsenide (GaAs), gallium arsenide antimonide (GaAsSb), gallium nitride (GaN), indium antimonide (InSb), indium arsenide (InAs), indium gallium arsenide (InGaAs), indium gallium arsenide phosphide (InGaAsP), indium gallium nitride (InGaN), indium nitride (InN), indium phosphide (InP) and alloy combinations including at least one of the foregoing materials. The alloy combinations can include binary (two elements, e.g., gallium (III) arsenide (GaAs)), ternary (three elements, e.g., InGaAs), and quaternary (four elements, e.g., aluminum gallium indium phosphide (AlInGaP)) alloys.

In various embodiments, the device silicon substrate 220 and the device silicon 224 may include any suitable material or combination of materials, such as doped or undoped silicon, glass, dielectrics, etc. For example, the substrate may include a silicon-on-insulator (SOI) structure, e.g., with a buried insulator layer, or a bulk material substrate, e.g., with appropriately doped regions, typically referred to as wells. In another embodiment, the substrate may be silicon with silicon oxide, nitride, or any other insulating film on top.

In order to fabricate the device buried oxide 222, high-energy ions (e.g., oxygen ions) are implanted into the device silicon substrate 220. The ions become embedded in the device silicon substrate 220 and create a buried layer of oxide. In an embodiment, the implanted wafer can be subjected to high-temperature annealing. This process allows the oxygen ions to diffuse within the silicon and form a continuous buried oxide layer. In some embodiments, the material used for the device buried oxide 222 is silicon dioxide (SiO2). In some cases, other insulating materials may be used, but SiO2 is a suitable choice due to its compatibility with silicon semiconductor processes and its established performance characteristics.

BEOL 228 can include metal interconnects, dielectric layers, and other components that connect and route signals between different devices and structures on the device wafer 202. In some embodiments, BEOL 228 includes intricate networks of metal interconnects that connect transistors, capacitors, and other active devices fabricated during the front end of line (FEOL) process. These interconnects can form the pathways for electrical signals to flow between different components on the device wafer 202. BEOL 228 can include dielectric materials deposited between metal interconnects to electrically insulate them and prevent unwanted electrical interactions or short circuits.

In some embodiments, the BEOL 228 can include the fabrication of a dielectric layer on top of the FEOL structures. The dielectric material is typically a low-k material to minimize signal delay and capacitance. After deposition, the dielectric layer may be planarized to ensure a flat surface for subsequent processing steps. Chemical Mechanical Polishing (CMP) can be used to remove excess dielectric material and achieve planarity.

In order to fabricate the device bonding oxide layer 226, the device wafer's surface is oxidized in an oxygen-rich environment at elevated temperatures, resulting in the growth of a thin layer of silicon dioxide on the surface. After oxidation, the oxide layer can be cleaned to remove any impurities or contaminants that may have accumulated during the oxidation process. Prior to bonding, the surfaces of the wafers to be bonded, i.e., the handler wafer and the device wafer, can be treated to ensure proper alignment and bonding quality. The wafers are brought into contact, and pressure or heat (thermal annealing) can be applied to initiate the bonding process. The oxide layers, i.e., the handler bonding oxide layer 216 and the device bonding oxide layer 226, at the interface, create covalent bonds between the wafers. The device bonding oxide layer 226 can be composed of silicon dioxide (SiO2).

FIG. 3 illustrates a semiconductor device 300 after the handler wafer and the device wafer are bonded together, in accordance with some embodiments. In some embodiments, the device wafer is flipped and bonded to the handler wafer via the handler bonding oxide layer 216 and the device bonding oxide layer 226. Bonding to the handler wafer can be a step in the wafer-level packaging process, where chips are enclosed and protected by additional layers.

In order to bond the handler wafer and the device wafer, the device wafer and handler wafer can be aligned to ensure accurate positioning of the individual devices with respect to the handler wafer's alignment marks or fiducials. The two wafers can then be brought into contact, aligning the devices on the device wafer with corresponding test sites or contacts on the handler wafer.

In some embodiments, the bonding process can utilize various bonding techniques, such as thermo-compression bonding, adhesive bonding, or anodic bonding (for glass wafers). Thermo-compression bonding involves applying heat and pressure to create a strong and reliable bond between the device and handler wafers. Once bonded, the devices on the device wafer can be accessible for testing and further processing. Testing may involve electrical and functional tests to ensure the quality and functionality of the devices. After testing and any additional processing, the individual devices are separated from the bonded wafer assembly.

FIG. 4 illustrates a semiconductor device 300 after removing portions of the backside of the device wafer, in accordance with some embodiments. In some embodiments, the grinding process is performed on the backside of the device wafer. The grinding can include removing the device silicon substrate and the device buried oxide. As a result, the top surface of the semiconductor device 400 includes the device silicon 224. Once the grinding process is performed, the overlay check process can be performed. In several embodiments, the semiconductor device 400 shows the least change in Young's modulus and Poisson's ratio along the surface directions. In some embodiments, using <111> silicon as the first silicon substrate in the handler wafer can lead to the reduction of overlay residual due to orthotropic properties and crystal orientation of the <111> silicon.

In various embodiments, in order to remove portions of the backside of the device wafer, processes such as grinding, chemical mechanical polishing (CMP), wet etching, and dry etching can be performed. Grinding is a mechanical process used to thin down semiconductor wafers to achieve a desired thickness or remove excess material from the wafer's surface. In some embodiments, the backside of the device wafer is thinned to reduce overall thickness and improve thermal performance. Grinding can use abrasive materials and tools to gradually remove material from the wafer. CMP can create a flat and smooth surface on semiconductor wafers and can involve simultaneously applying chemical reactions and mechanical abrasion to remove material from the wafer's surface. A rotating polishing pad or pad-like material can be used along with a chemical slurry to remove material and achieve planarity. Dry etching can selectively remove material from the surface of the semiconductor wafer using reactive gases and plasma and uses a high-energy plasma that contains reactive ions and radicals to etch specific materials chemically. The process can be anisotropic or isotropic, depending on the etch chemistry and conditions. Wet etching removes materials from the surface of the semiconductor wafer using chemical solutions, and can be isotropic, i.e., it etches uniformly in all directions, or anisotropic, i.e., it occurs primarily in one direction. Wet etch can involve immersing the wafer in a chemical solution that reacts with the material to be removed.

Figure 5:
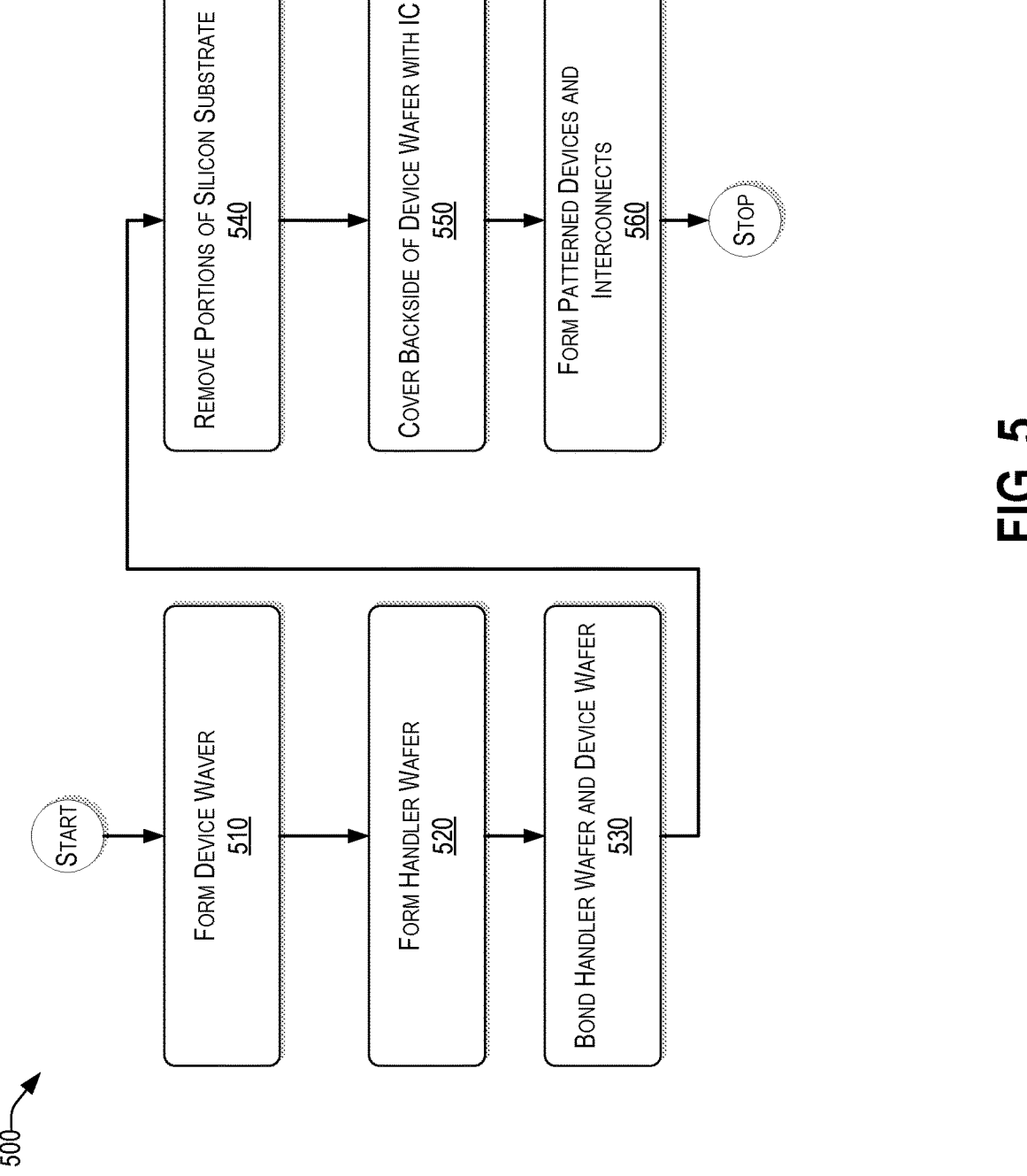
FIG. 5 illustrates a block diagram of a method for forming the semiconductor device, in accordance with some embodiments.

FIG. 5 illustrates a block diagram of a method 500 for forming the semiconductor device, in accordance with some embodiments. The method 500 can begin when a device wafer is formed, as shown by block 510.

In an embodiment, method 500 proceeds when a handler wafer is formed, as shown by block 520.

Method 500 continues when the handler wafer and the device wafer are bonded together, as shown by block 530.

In some embodiments, method 500 continues when portions of the silicon substrate on the device wafer are removed, as shown by block 540.

Method 500 can proceed when the backside of the device wafer is covered with one or more integrated circuits, as shown by block 550.

Method 500 can then proceed when one or more patterned devices and interconnects are formed, as shown by block 560.

In one aspect, the method and structures described above may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip may be mounted in a single chip package (such as a plastic carrier, with leads that are affixed to a motherboard or other higher-level carrier) or in a multichip package (such as a ceramic carrier that has either or both surface interconnections or buried interconnections). In any case, the chip can then be integrated with other chips, discrete circuit elements, and/or other signal processing devices as part of either (a) an intermediate product, such as a motherboard, or (b) an end product. The end product can be any product that includes integrated circuit chips, ranging from low-end applications, such as toys, to advanced computer products having a display, a keyboard or other input device, and a central processor.

CONCLUSION

The descriptions of the various embodiments of the present teachings have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications, and variations that fall within the true scope of the present teachings.

The components, steps, features, objects, benefits, and advantages that have been discussed herein are merely illustrative. None of them, nor the discussions relating to them, are intended to limit the scope of protection. While various advantages have been discussed herein, it will be understood that not all embodiments necessarily include all advantages. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits and advantages. These also include embodiments in which the components and/or steps are arranged and/or ordered differently.

While the foregoing has been described in conjunction with exemplary embodiments, it is understood that the term "exemplary" is merely meant as an example, rather than the best or optimal. Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments have more features than are expressly recited in each claim. Rather, as the following claims reflect, the inventive subject matter lies in less than all features of a single disclosed embodiment. Thus, the following claims are hereby incorporated into the Detailed Description, with each claim standing on its own as a separately claimed subject matter.

What is claimed is:

1. A semiconductor device, comprising:
a device wafer including a silicon layer, an interconnect, and a first bonding oxide layer, wherein the interconnect is located between the first bonding oxide layer and the silicon layer; and
a handler wafer bonded to the device wafer, wherein the handler wafer includes a 111 crystallographic direction silicon substrate, wherein the handler wafer includes a second bonding oxide layer, wherein the second bonding oxide is in direct contact with the silicon substrate, wherein the second bonding oxide layer is in direct contact with the first bonding oxide layer;
wherein a backside of the device wafer is covered by multilevel wiring layers;
wherein the multilevel wiring layers include a backside power delivery network (BSPDN).

2. The semiconductor device of claim 1, wherein the silicon wafer has a thickness of less than 1 micrometer.

3. The semiconductor device of claim 2, wherein a backside of the device wafer is covered by one or more integrated devices.

4. The semiconductor device of claim 1, wherein the device wafer further includes patterned devices on a frontside surface.

5. The semiconductor device of claim 1, wherein the interconnect includes one or more levels of middle of line/back end of line (MOL/BEOL).

6. The semiconductor device of claim 1, wherein the silicon wafer includes a 100 crystallographic direction or a 110 crystallographic direction silicon wafer.

7. A method for formation of a semiconductor device, the method comprising:
forming a device wafer, wherein the device wafer includes a first silicon substrate layer, an interconnect, and a first bonding oxide layer, wherein the interconnect is located between the first bonding oxide layer and the first silicon substrate layer;
forming a handler wafer, wherein the handler wafer includes a second bonding oxide layer;
bonding the handler wafer to the device wafer, wherein the handler wafer includes a 111 crystallographic direction second silicon substrate, wherein the second bonding oxide is in direct contact with the second silicon substrate, wherein the second bonding oxide layer is in direct contact with the first bonding oxide layer; and removing portions of the first silicon substrate layer;
covering a backside of the device wafer with multilevel wiring layers;
wherein the multilevel wiring layers include a backside power delivery network (BSPDN).

8. The method of claim 7, further comprising covering a backside of the device wafer by one or more integrated devices.

9. The method of claim 7, further comprising forming patterned devices a frontside surface of the device wafer.

10. The method of claim 7, wherein the interconnect includes one or more levels of middle of line/back end of line (MOL/BEOL).

11. The method of claim 7, wherein removing portions of the first silicon substrate includes utilizing one or more of: grinding, chemical mechanical polishing, wet etching, and dry etching.

12. A method of formation of a semiconductor device, the method comprising:

forming a device wafer, wherein the device wafer includes a silicon layer, an interconnect, and a first bonding oxide layer, wherein the interconnect is located between the first bonding oxide layer and the silicon layer; and bonding a handler wafer to the device wafer, wherein the handler wafer includes a second bonding oxide layer, wherein the handler wafer includes a 111 crystallographic direction silicon substrate, wherein the second bonding oxide is in direct contact with the silicon substrate, wherein the second bonding oxide layer is in direct contact with the first bonding oxide layer;

wherein a backside of the device wafer is covered by multilevel wiring layers;

wherein the multilevel wiring layers include a backside power delivery network (BSPDN).

\* \* \* \* \*